United States Patent
Lee

(10) Patent No.: US 9,973,168 B2
(45) Date of Patent: May 15, 2018

(54) CRYSTAL VIBRATOR PACKAGE

(71) Applicant: Samsung Electro-Mechanics Co., Ltd., Suwon-si (KR)

(72) Inventor: Jae Sang Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 254 days.

(21) Appl. No.: 14/937,134

(22) Filed: Nov. 10, 2015

(65) Prior Publication Data
US 2016/0163956 A1   Jun. 9, 2016

(30) Foreign Application Priority Data

Dec. 4, 2014 (KR) .................. 10-2014-0173228

(51) Int. Cl.
*H01L 41/09* (2006.01)
*H03H 9/10* (2006.01)
*H03H 9/13* (2006.01)

(52) U.S. Cl.
CPC .......... *H03H 9/1021* (2013.01); *H03H 9/132* (2013.01)

(58) Field of Classification Search
CPC .... H03H 9/1021; H03H 9/132; H03H 9/0595; H03H 9/176; H03H 2009/2442; H01L 41/0913; H01L 41/0833; H01L 41/083
USPC ................. 310/321, 367, 368, 369
See application file for complete search history.

(56) References Cited

U.S. PATENT DOCUMENTS

| 2011/0227457 | A1* | 9/2011 | Ishikawa | H03H 3/02 310/344 |
| 2013/0207735 | A1* | 8/2013 | Yoshida | H03H 9/17 331/158 |
| 2013/0328450 | A1* | 12/2013 | Takahashi | H01L 41/053 310/348 |
| 2014/0368089 | A1* | 12/2014 | Omomo | H03H 3/02 310/348 |
| 2015/0188025 | A1* | 7/2015 | Otake | H01L 41/053 206/701 |

FOREIGN PATENT DOCUMENTS

| JP | 2007-104042 A | 4/2007 |
| JP | 2011-61418 A | 3/2011 |
| KR | 10-2009-0094981 A | 9/2009 |

OTHER PUBLICATIONS

English Translation of JP 2011061418.*

* cited by examiner

*Primary Examiner* — Bryan Gordon
(74) *Attorney, Agent, or Firm* — NSIP Law

(57) ABSTRACT

The crystal vibrator package includes a base substrate, a crystal piece, and a reinforcing patter. The base substrate includes first and second electrode pads formed on an upper surface of the base substrate. The crystal piece includes exciting electrodes formed on upper and lower surfaces thereof and electrically connected to the first and second electrode pads, respectively, at one side of the crystal piece. The reinforcing pattern is formed at corner portions of the crystal piece.

20 Claims, 5 Drawing Sheets

A-A

A-A

B-B

CRYSTAL VIBRATOR PACKAGE

CROSS-REFERENCE TO RELATED APPLICATION

This application claims the priority and benefit under 35 USC 119(a) of Korean Patent Application No. 10-2014-0173228 filed on Dec. 4, 2014, with the Korean Intellectual Property Office, the disclosure of which is incorporated herein by reference.

BACKGROUND

1. Field

The following description relates to a crystal vibrator package in which equivalent series resistance (ESR) is decreased.

2. Description of Related Art

A crystal vibrator is used for various applications, such as a frequency oscillator, a frequency regulator, a frequency converter, and other similar devices. The crystal vibrator uses a crystal having excellent piezoelectric characteristics and is made of a piezoelectric material. The crystal serves as a stable mechanical vibration generator.

The crystal is artificially grown in a high-pressure autoclave, cut in relation to a crystal axis, and is processed to be of a size and shape having desired characteristics. Thus, the crystal is manufactured in a wafer form.

Equivalent series resistance (ESR) is an index determining performance of the crystal vibrator. The lower the ESR value, the crystal vibrator becomes more responsive, with higher energy efficiency.

A mesa type vibrator of which a central portion is flat and thick and a peripheral portion thereof is thin has a low ESR. However, such configuration of the mesa type vibrator is difficult to manufacture, with a high probability of being damaged.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a crystal vibrator package, including: a base substrate including first and second electrode pads formed on an upper surface of the base substrate; a crystal piece including exciting electrodes formed on upper and lower surfaces thereof and electrically connected to the first and second electrode pads, respectively, at one side of the crystal piece; and a reinforcing pattern formed at corner portions of the crystal piece.

The reinforcing pattern may be formed in a triangular shape, at a corner portion of the crystal piece having a rectangular shape.

Reinforcing patterns may be formed on both surfaces of the crystal piece.

The reinforcing pattern may be electrically connected to the exciting electrodes.

The reinforcing pattern may electrically connect at least one of the exciting electrodes and the first electrode pad to each other.

A side of the reinforcing pattern may face at least one of the exciting electrodes is linear.

A corner portion of at least one of the exciting electrodes may face the reinforcing pattern has a linear side.

A side of the reinforcing pattern may face at least one of the exciting electrodes has an arc shape, concave inwardly.

A side of at least one of the exciting electrodes may face the reinforcing pattern has an arc shape, convex toward the reinforcing pattern.

A curvature of an arc formed at a corner portion of at least one of the exciting electrodes may be the same as a curvature of an arc formed at the reinforcing pattern.

The crystal piece may be formed to have uniform thickness.

The reinforcing pattern may include connection electrodes, wherein the connection electrodes and a dummy electrode have right-angled triangular shapes of which longest sides face the exciting electrodes.

The exciting electrodes may include a rectangular shape in which rectangular corner portions thereof are rounded in an arc shape.

The exciting electrodes may include a shape in accord with directions and shape forms of vibrations in response to an electrical signal.

Reinforcing patterns may be formed on both surfaces of the crystal piece, and are disposed to face all corner portions of the crystal piece.

At least one of the connection electrodes may be connected to the exciting electrodes through connecting electrodes disposed on both surfaces of the crystal piece.

The connection electrodes, each may have one side connected to the exciting electrodes, respectively, and the other side may be electrically connected to the first and second electrode pads, respectively, through a conductive adhesive.

In accordance with an embodiment, there is provided a crystal vibrator package, including: a crystal piece; exciting electrodes formed at a center of the crystal piece; and a reinforcing pattern positioned outside of the exciting electrodes along a circumference of the crystal piece.

The reinforcing pattern may be disposed respectively at corner portions of the crystal piece.

The reinforcing pattern may be electrically connected to the exciting electrode.

The reinforcing pattern may be formed to have same or substantially similar thickness as a thickness of the exciting electrodes.

Other features and aspects will be apparent from the following detailed description, the drawings, and the claims.

BRIEF DESCRIPTION OF DRAWINGS

The above and other aspects, features and advantages of the present disclosure will be more clearly understood from the following detailed description taken in conjunction with the accompanying drawings, in which.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
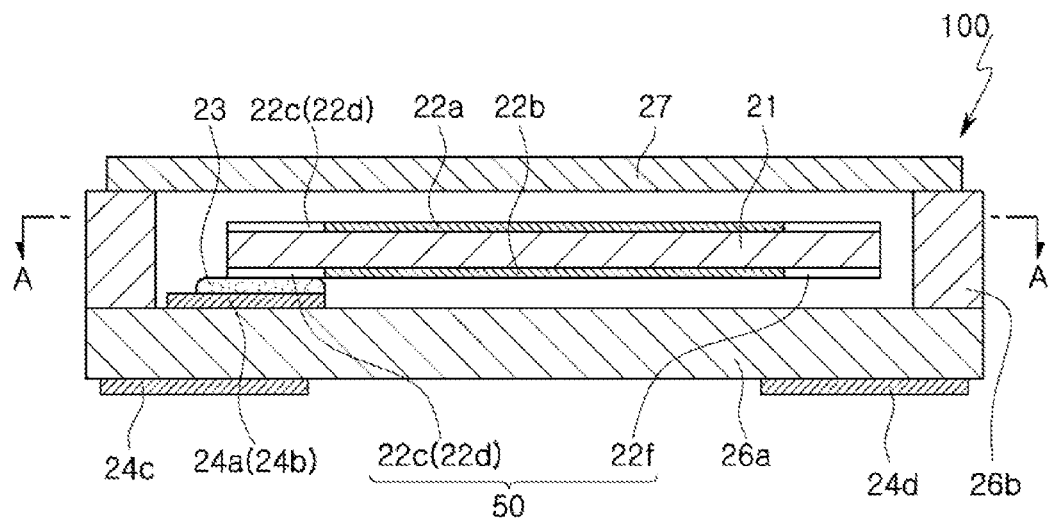
FIG. 1 is a side cross-sectional view of a crystal vibrator package, according to an embodiment.
Figure 2:
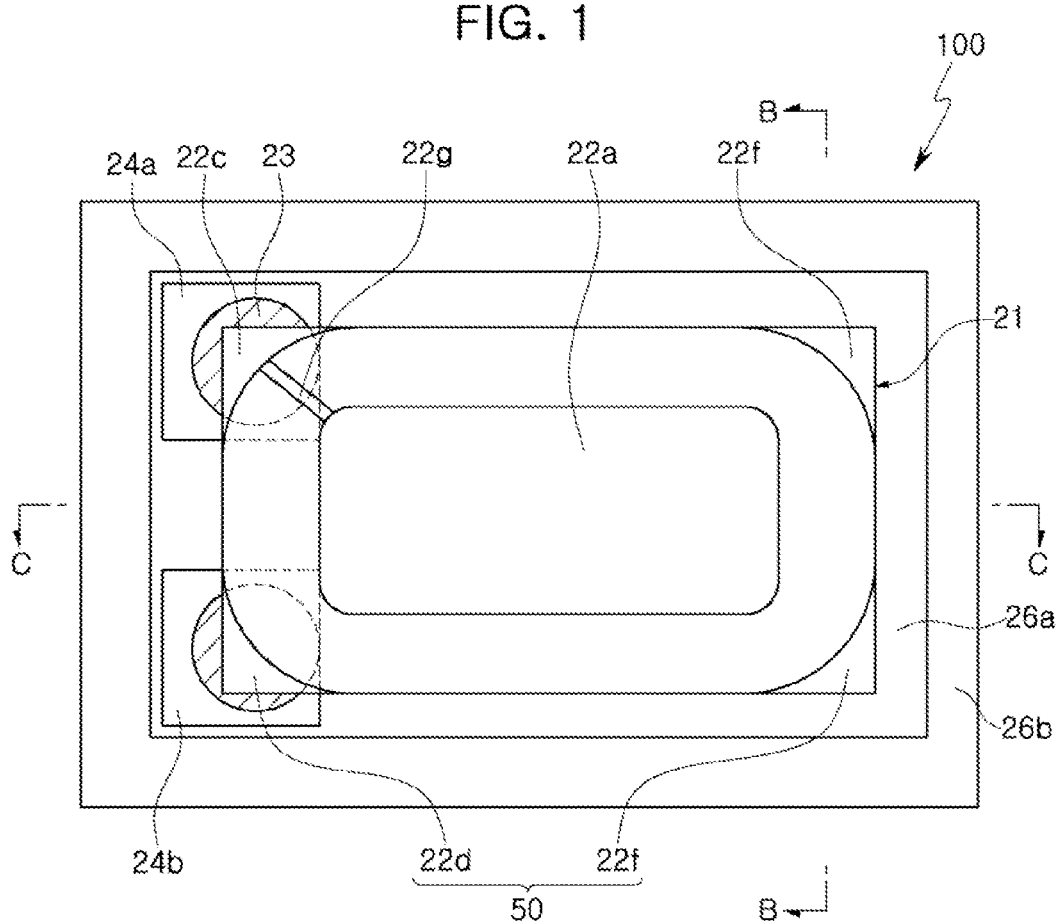
FIG. 2 is a cross-sectional view taken along line A-A of FIG. 1.

FIG. 1 is a side cross-sectional view of a crystal vibrator package, according to an embodiment, illustrating a cross section of a rectangular crystal vibrator taken in a length direction. FIG. 2 is a cross-sectional view taken along line A-A of FIG. 1. Further, FIG. 1 illustrates a cross section taken along line C-C of FIG. 2.

Figure 3:
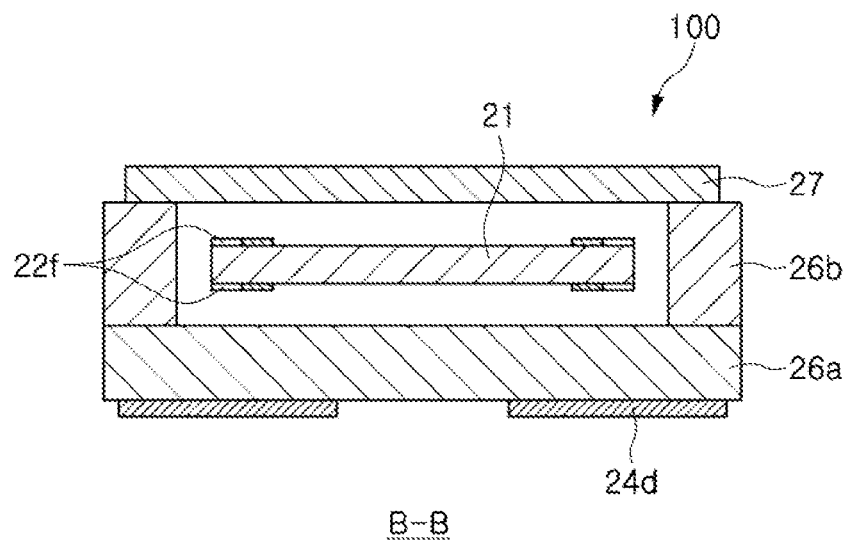
FIG. 3 is a cross-sectional view taken along line B-B of FIG. 2.

In addition, FIG. 3 is a cross-sectional view taken along line B-B of FIG. 2.

Referring to FIGS. 1 through 3, a crystal vibrator package 100, according to an embodiment, includes a crystal piece 21, exciting electrodes 22a and 22b, connection electrodes 22c and 22d, dummy electrodes 22f, a conductive adhesive 23, first and second electrode pads 24a and 24b, external electrode pads 24c and 24d, a base substrate 26a, a support part 26b, a lid 27, and a reinforcing pattern 50. The first and second electrode pads 24a and 24b are formed on an upper surface of the base substrate 26a. The crystal piece 21 has one side fixedly positioned on the first and second electrode pads 24a and 24b and includes the exciting electrodes 22a and 22b formed on upper and lower surfaces thereof, respectively, to vibrate in response to an electrical signal. The exciting electrodes 22a and 22b are electrically connected to the first and second electrode pads 24a and 24b. The support part 26b is formed along a peripheral edge of the base substrate 26a and forms an internal space accommodating the crystal piece 21 therein. The lid 27 is positioned on the support part 26b to seal the internal space. In one example, the base substrate 26a, the support part 26b, and the lid 27 are commonly called a package.

The base substrate 26a is positioned at a bottom of the crystal vibrator package 100 and is formed of an insulating ceramic material, such as, an aluminum oxide sintered body. The base substrate 26a is formed through molding, stacking, and sintering ceramic green sheets.

The first and second electrode pads 24a and 24b are formed on one side of the upper surface of the base substrate 26a. In addition, the support part 26b is formed along an edge of the base substrate 26a.

The base substrate 26a includes a plurality of external electrode pads 24c and 24d formed on a lower surface thereof in order to externally receive electrical signals. At least one of the external electrode pads 24c and 24d is electrically connected to the first electrode pad 24a, and the other of the external electrode pads 24c and 24d is electrically connected to the second electrode pad 24b.

The first and second electrode pads 24a and 24b and the external electrode pads 24c and 24d are electrically connected to each other using conductive vias (not illustrated) formed in the base substrate 26a. In addition, at least a portion of external electrode pads 24c and 24d is used as a ground electrode.

The first and second electrode pads 24a and 24b are electrically connected to the exciting electrodes 22a and 22b and are formed on the upper and lower surfaces of the crystal piece 21, respectively. The first and second electrode pads 24a and 24b are used as paths providing electrical signals to the crystal piece 21. A piezoelectric effect is generated in the crystal piece 21 by the above-mentioned electrical signals.

The first and second electrode pads 24a and 24b are formed of a conductive metal, such as at least one of gold (Au), silver (Ag), tungsten (W), copper (Cu), and molybdenum (Mo).

The support part 26b is formed along the peripheral edge of the base substrate 26a, and forms the internal space with the base substrate 26a in which the crystal piece 21, according to an embodiment, is accommodated.

The support part 26b is formed of an insulating ceramic material, which is the same material as that of the base substrate 26a. In the alternative, the support part 26b is formed of a conductive metal alloy, which is the same material as that of the lid 27.

The crystal piece 21, which is a piezoelectric substrate polished to a predetermined thickness depending on an oscillation frequency, is manufactured by cutting and processing a crystal wafer using, for instance, photolithography technology.

The crystal piece 21 has a substantially rectangular shape, and is formed to have substantially consistent thickness along the entire piece.

The crystal piece 21, according to an embodiment, is cut at an AT-cut. As a result, thickness sliding vibrations are excited as producing main vibrations in the crystal piece 21.

An AT-cut crystal plate has been widely used as a crystal vibrator having the thickness sliding vibrations as the main vibrations because temperature variations from room temperature resulting in frequency changes are relatively small. However, a configuration of the crystal piece 21, according to an embodiment, is not limited thereto.

The exciting electrodes 22a and 22b, connection electrodes 22c and 22d, and reinforcing patterns are formed on the crystal piece 21.

The exciting electrodes 22a and 22b are disposed on central portions of both surfaces of the crystal piece 21. The exciting electrodes 22a and 22b apply the electrical signal to the crystal piece 21 to vibrate the crystal piece 21. To this end, the exciting electrodes 22a and 22b are formed in the same shape on both surfaces of the crystal piece 21, respectively.

The exciting electrodes 22a and 22b, according to an embodiment, have a rectangular shape in which rectangular corner portions thereof are rounded in an arc shape. That is, corner portions of the exciting electrodes 22a and 22b facing the reinforcing patterns 50 have an arc shape convex toward the reinforcing patterns 50. In one example, curvatures of portions having the arc shape correspond to or are similar to those of arcs formed in the reinforcing patterns 50 to be described below.

Vibrations generated in the crystal piece are generally generated in a circular shape or an oval shape from the center of the crystal piece at which the exciting electrodes 22a and 22b are formed. In addition, the exciting electrodes 22a and 22b, according to an embodiment, have a shape in accord with directions and shape forms in which the vibrations are generated.

In a case in which the corner portions of the exciting electrodes 22a and 22b are formed in the arc shape, as described above, the exciting electrodes 22a and 22b are disposed at portions at which the vibrations are not generated, such that a decrease in efficiency of the vibrations are significantly suppressed.

The connection electrodes 22c and 22d have one side connected to the exciting electrodes 22a and 22b, respectively, and the other side is electrically connected to the first and second electrode pads 24a and 24b, respectively, through a conductive adhesive 23.

The respective connection electrodes 22c and 22d are formed on both surfaces of one side of the crystal piece 21, respectively. In this case, because both surfaces of the crystal piece 21 have the same or similar shape, the crystal piece 21 is bonded to the base substrate 26a, without distinguishing upper and lower surfaces thereof from each other.

In addition, at least one of the connection electrodes 22c and 22d are connected to the exciting electrodes 22a and 22b through connecting electrodes 22g. Therefore, the connecting electrodes 22g are disposed on both surfaces of the crystal piece 21, respectively.

The exciting electrodes 22a and 22b, the connection electrodes 22c and 22d, and the connecting electrodes 22g are formed of a metal coating formed through a sputtering method or a depositing method, on a material such as chromium (Cr), nickel (Ni), gold (Au), or silver (Ag). However, the exciting electrodes 22a and 22b, the connection electrodes 22c and 22d, and the connecting electrodes 22g may be formed through other methods and formed of other materials.

The crystal piece 21, configured as described above, has one side fixed within the internal space formed by the base substrate 26a and the support part 26b. In detail, the crystal piece 21 is bonded onto the base substrate 26a using the conductive adhesive 23 so that the first and second electrode pads 24a and 24b formed on the base substrate 26a and the exciting electrodes 22a and 22b formed on the upper and lower surfaces of the crystal piece 21, respectively, are electrically connected to each other.

In one example, the exciting electrodes 22a and 22b are electrically connected to the first and second electrode pads 24a and 24b through the connecting electrodes 22g and the connection electrodes 22c and 22d.

The lid 27 is disposed to be seated on an upper end of the support part 26b in order to seal the internal space in which the crystal piece 21 is mounted, thus, closing the internal space. The lid 27 is also fixed and bonded to the support part 26b through a conductive adhesive (not shown).

Because efficiency and quality in the operation and life of the crystal vibrator are significantly affected by a change in an external environment, pollution, and other external sources, the crystal vibrator package 100 is sealed to reduce a leakage rate thereof and protect the crystal piece 21 from an external environment and pollutants of the crystal vibrator package 100.

In one configuration, the lid 27 air-tightly seals an inner portion of the crystal vibrator package 100. In addition, the internal space of the crystal vibrator package 100 is sealed in a vacuum state or in a state in which inert gas such as nitrogen, helium, or argon, is injected.

In addition, the crystal piece 31, according to and embodiment, includes at least one or more reinforcing patterns 50.

The reinforcing patterns 50 are disposed outside the exciting electrodes 22a and 22b, along a circumference of the crystal piece 21. For example, the reinforcing patterns 50 is formed at the corner portions of the crystal piece 21, and are disposed to be spaced apart from the exciting electrodes 22a and 22b by a predetermined distance.

The reinforcing patterns 50 are formed on both surfaces of the crystal piece 21, and are disposed to face all corner portions of the crystal piece 21 having a rectangular shape. Therefore, the reinforcing patterns 50 simultaneously protects the corner portions from external force while reinforcing rigidity of the corner portions of the crystal pieces 21.

In addition, the reinforcing patterns 50 reinforces thicknesses of the corner portions of the crystal piece 21 to suppress unnecessary vibrations from being generated in the corner portions. Therefore, equivalent series resistance (ESR) of the crystal piece 21 is decreased.

The respective reinforcing patterns 50, according to an embodiment, has a substantially triangular shape, and elongated sides facing the exciting electrodes 22a and 22b. The respective reinforcing patterns 50 has, among three sides forming the triangular shape, an arc shape concaving inwardly. In one embodiment, a curvature of an arc is the same as or similar to that of the arc formed in the exciting electrodes 22a and 22b facing the reinforcing pattern 50.

In addition, the reinforcing patterns 50, according to an embodiment, includes dummy electrodes 22f and the connection electrodes 22c and 22d.

The connection electrodes 22c and 22d are formed on one side of the crystal piece 21 to be electrically connected to the exciting electrodes 22a and 22b and be electrically connected to the first and second electrode pads 24a and 24b of the base substrate 26a, through the conductive adhesive 23, as described above.

That is, the connection electrodes 22c and 22d serve to electrically connect the exciting electrodes 22a and 22b and the first and second electrode pads 24a and 24b to each other and have the same shape as that of the dummy electrodes 22f.

The dummy electrodes 22f are formed at corner portions of the crystal piece 21, opposite to the corner portions of the crystal piece 21 at which the connection electrodes 22a and 22d are formed. That is, the dummy electrodes 22f are formed at corner portions of the other side of the crystal piece 21 at which the connection electrodes 22c and 22d are not present. Further, the dummy electrodes 22f have a shape and a size corresponding to those of the connection electrodes 22c and 22d. In addition, the dummy electrodes 22f are formed on both surfaces of one side of the crystal piece 21 and are connected to each other, similar to the connection electrodes 22c and 22d.

In one example, the dummy electrodes 22f are not electrically connected to the exciting electrodes 22a and 22b or the electrode pads 24a and 24b. However, the dummy electrodes 22f are not limited thereto, and may also be electrically connected to the exciting electrodes 22a and 22b or the electrode pads 24a and 24b.

The reinforcing patterns 50 are formed together with the exciting electrodes 22a and 22b in a process of forming the exciting electrodes 22a and 22b on the crystal piece 21.

Therefore, the reinforcing patterns 50 are formed of the same material as that of the exciting electrodes 22a and 22b and are formed with same or substantially similar thickness as that of the exciting electrodes 22a and 22b. The reinforcing patterns 50 may have uniform thickness. However, a material and a thickness of the reinforcing patterns 50 are not limited to thereto and other materials and variations in thicknesses may exist.

The crystal vibrator package 100, according to an embodiment, includes the reinforcing patterns 50, such that an ESR value of the crystal piece 21 is reduced.

Figure 4:
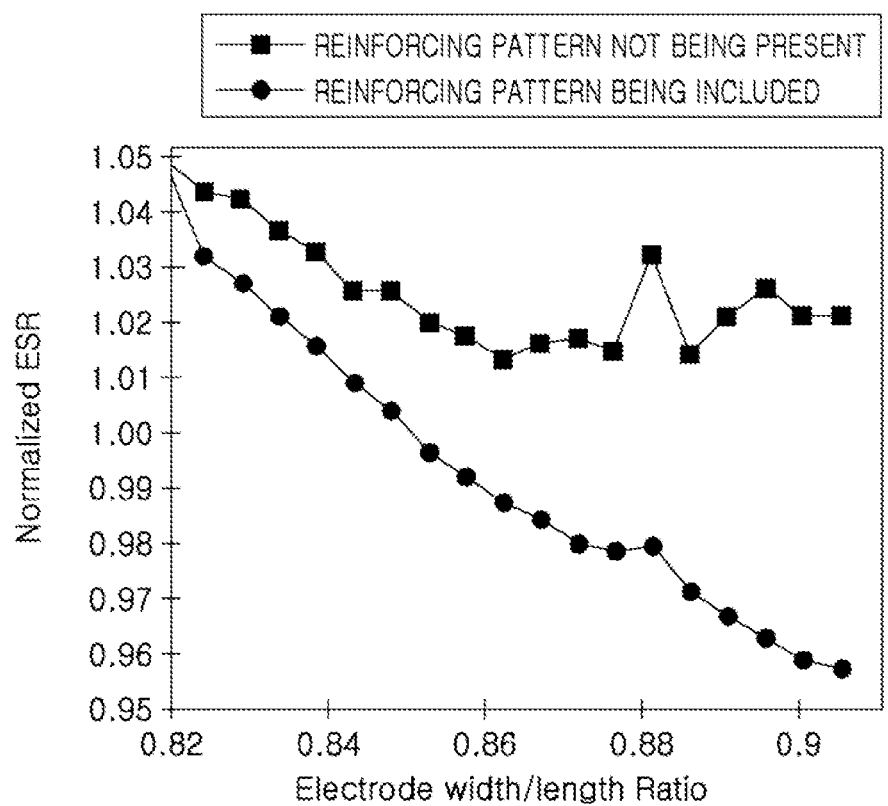
FIG. 4 is a graph illustrating measurement results of equivalent series resistance (ESR) changes of a crystal piece, according to an embodiment, and a crystal piece that excludes a reinforcing pattern.

FIG. 4 is a graph illustrating a measurement result of ESR changes of a crystal piece, according to an embodiment, and a crystal piece that excludes a reinforcing pattern. Here, a horizontal axis indicates a change in a ratio between width/length of the exciting electrode.

It may be appreciated from FIG. 4 that ESRs are all, relatively low in the crystal piece, according to an embodiment, than in the crystal piece that excludes the reinforcing pattern.

In addition, it may be appreciated that, as the ratio between width/length of the exciting electrode is increased, an ESR value of the crystal piece that excludes the reinforcing pattern is not reduced to a threshold value, for example, 1.01, or lower, while an ESR value of the crystal piece is continuously reduced.

Therefore, it may be appreciated that ESR is significantly reduced when using the crystal piece, according to an embodiment, compared to a conventional crystal piece that excludes the reinforcing pattern 50.

Meanwhile, the present disclosure is not limited to the above-mentioned exemplary embodiments, and may be variously modified.

Figure 5:
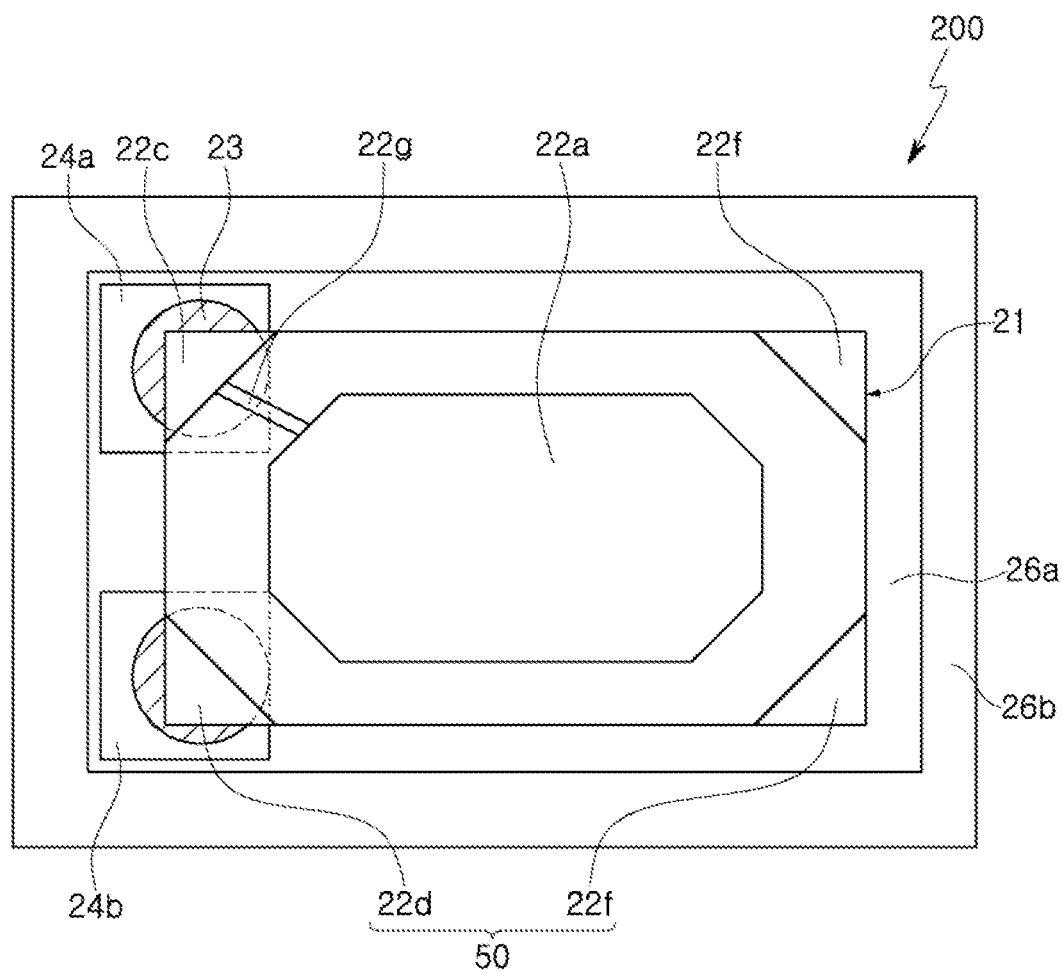
FIG. 5 is a view schematically illustrating a crystal vibrator package, according to another embodiment.

FIG. 5, which is a view of a crystal vibrator package, according to another embodiment, illustrates a cross section corresponding to FIG. 2.

Referring to FIG. 5, in the crystal vibrator package 200, according to an embodiment, the reinforcing patterns 50 have a triangular shape, and sides thereof facing the exciting electrodes 22a and 22b have a linear shape instead of an arc shape as in the previous embodiment.

Therefore, the reinforcing patterns 50 has a completely triangular shape. In addition, correspondingly, corner portions of the exciting electrodes 22a and 22b have linear sides and do not have arc-shaped sides.

In one example, sides formed at the corner portions of the exciting electrodes 22a and 22b and inner sides of the reinforcing patterns 50 are in parallel with each other. However, the sides formed at the corner portions of the exciting electrodes 22a and 22b and the inner sides of the reinforcing patterns 50 are not limited to thereto.

Further, the various embodiments described above may be combined with each other. In addition, various modifications may be made. For example, the crystal piece 21 may be configured using the reinforcing patterns 50 with arc shape inner sides and the exciting electrodes 22a and 22b having corner portions with a linear shape. In the alternative, the crystal piece 21 may be configured using the reinforcing patterns 50 with linear shape inner sides and the exciting electrodes 22a and 22b having corner portions with an arc shape.

Figure 6:
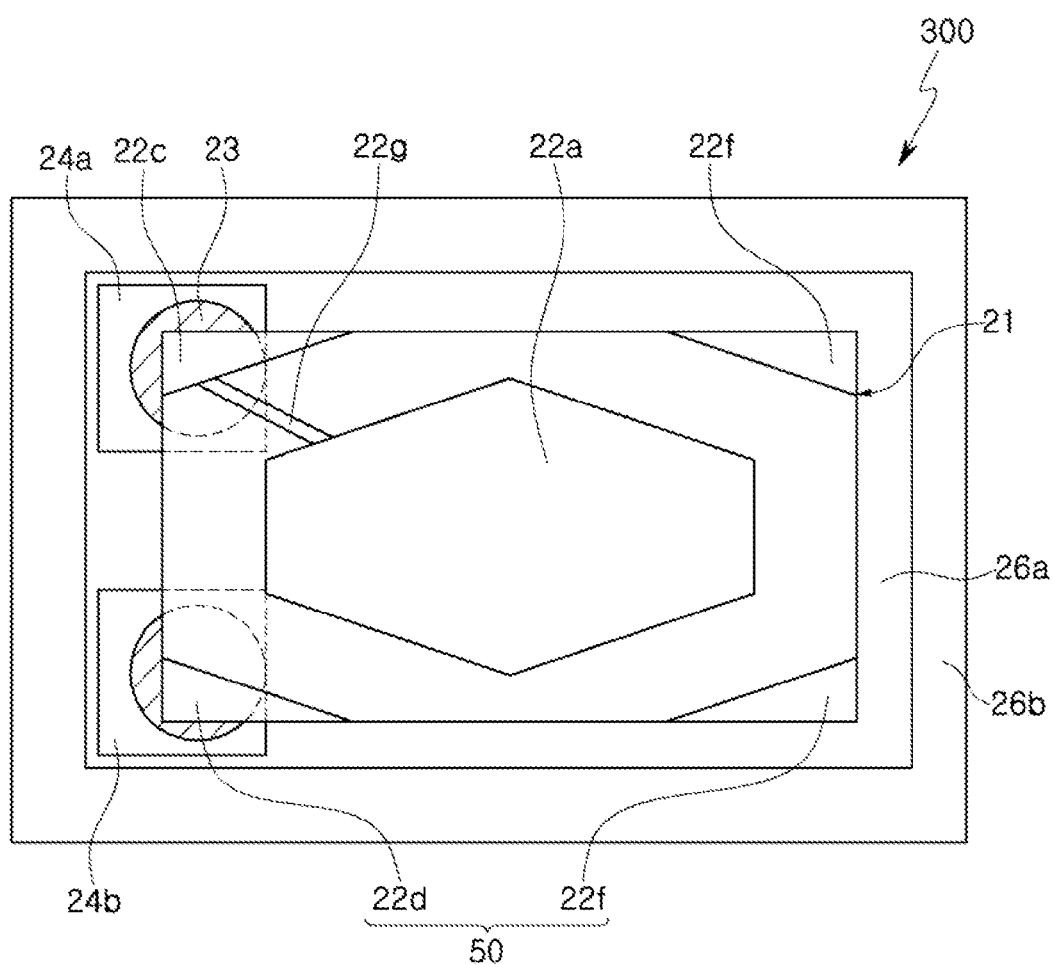
FIGS. 6 and 7 are views schematically illustrating crystal vibrator packages, according to other embodiments.
Figure 7:
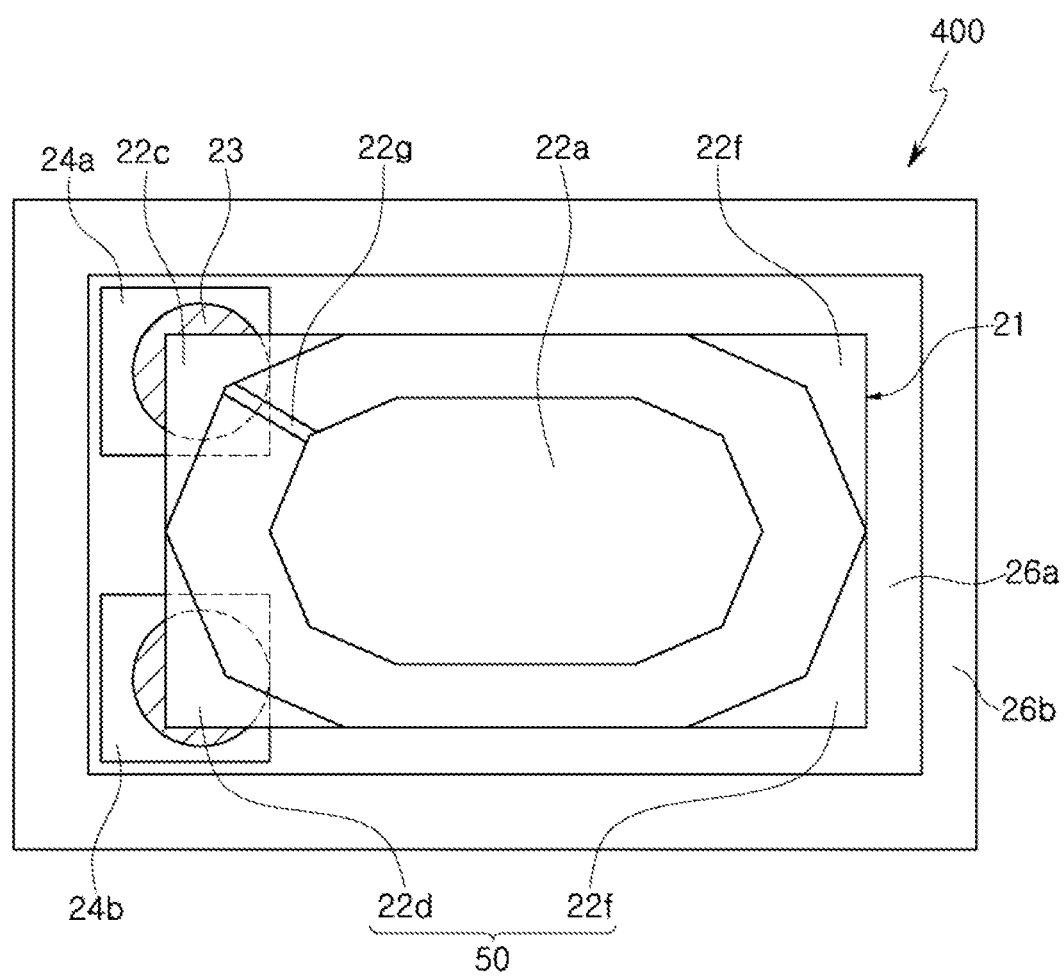

In addition, FIGS. 6 and 7 are views schematically illustrating crystal vibrator packages, according to other embodiments. As illustrated in FIGS. 6 and 7, in crystal vibrator packages 300 and 400, reinforcing patterns 50 and exciting electrodes 22a and 22b are variously modified. The reinforcing patterns 50 are formed at corner portions of a crystal piece 21 and the exciting electrodes 22a and 22b are disposed to correspond to the reinforcing patterns 50.

Furthermore, although the crystal piece, which is a piezoelectric device, and a package having the same have been described by way of example in the embodiments, a crystal vibrator may be used in which an oscillator circuit element oscillating the crystal vibrator is installed in the package.

As set forth above, according to various embodiments, ESR generated in the crystal piece is significantly decreased through a configuration of the reinforcing patterns formed at the crystal piece. In addition, rigidity of the corner portions of the crystal piece is enhanced.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A crystal vibrator package, comprising:
   a base substrate comprising first and second electrode pads formed on an upper surface of the base substrate;
   a crystal piece comprising exciting electrodes formed on upper and lower surfaces thereof and electrically connected to the first and second electrode pads, respectively, at one side of the crystal piece; and
   a reinforcing pattern formed at corner portions of the crystal piece in a substantially triangular shape.

2. The crystal vibrator package of claim 1, wherein the crystal piece comprises a rectangular shape.

3. The crystal vibrator package of claim 2, wherein reinforcing patterns are formed on both surfaces of the crystal piece.

4. The crystal vibrator package of claim 1, wherein the reinforcing pattern is electrically connected to the exciting electrodes.

5. The crystal vibrator package of claim 1, wherein the reinforcing pattern electrically connects at least one of the exciting electrodes and the first electrode pad to each other.

6. The crystal vibrator package of claim 2, wherein a side of the reinforcing pattern facing at least one of the exciting electrodes is linear.

7. The crystal vibrator package of claim 6, wherein a corner portion of at least one of the exciting electrodes facing the reinforcing pattern has a linear side.

8. The crystal vibrator package of claim 2, wherein a side of the reinforcing pattern facing at least one of the exciting electrodes has an arc shape, concave inwardly.

9. The crystal vibrator package of claim 8, wherein a side of at least one of the exciting electrodes facing the reinforcing pattern has an arc shape, convex toward the reinforcing pattern.

10. The crystal vibrator package of claim 9, wherein a curvature of an arc formed at a corner portion of at least one of the exciting electrodes is the same as a curvature of an arc formed at the reinforcing pattern.

11. The crystal vibrator package of claim 1, wherein the crystal piece is formed to have uniform thickness.

12. The crystal vibrator package of claim 2, wherein the reinforcing pattern comprises connection electrodes, wherein the connection electrodes and a dummy electrode have right-angled triangular shapes of which longest sides face the exciting electrodes.

13. The crystal vibrator package of claim 1, wherein the exciting electrodes comprise a rectangular shape in which rectangular corner portions thereof are rounded in an arc shape.

14. The crystal vibrator package of claim 1, wherein the exciting electrodes comprise a shape in accord with directions and shape forms of vibrations in response to an electrical signal.

15. The crystal vibrator package of claim 1, wherein reinforcing patterns are formed on both surfaces of the crystal piece, and are disposed to face all corner portions of the crystal piece.

16. The crystal vibrator package of claim 1, wherein at least one of the connection electrodes are connected to the exciting electrodes through connecting electrodes disposed on both surfaces of the crystal piece.

17. The crystal vibrator package of claim 1, wherein the connection electrodes, each have one side connected to the exciting electrodes, respectively, and the other side is electrically connected to the first and second electrode pads, respectively, through a conductive adhesive.

18. A crystal vibrator package, comprising:
a crystal piece;
exciting electrodes formed at a center of the crystal piece; and
a reinforcing pattern positioned outside of the exciting electrodes in a substantially triangular shape, at a corner portion of the crystal piece.

19. The crystal vibrator package of claim 18, wherein the reinforcing pattern is electrically connected to the exciting electrode.

20. The crystal vibrator package of claim 18, wherein the reinforcing pattern is formed to have same or substantially similar thickness as a thickness of the exciting electrodes.

* * * * *